United States Patent
Steinbuchel, IV et al.

(10) Patent No.: US 11,955,260 B2
(45) Date of Patent: Apr. 9, 2024

(54) METAL-OXIDE VARISTORS (MOVS) IN GRID CORD CONNECTOR

(71) Applicant: Webasto Charging Systems, Inc., Monrovia, CA (US)

(72) Inventors: Herman Joseph Steinbuchel, IV, Pasadena, CA (US); Peter Gabrielsson, Monrovia, CA (US); Manuel Miranda, Monrovia, CA (US); Michael Vail, Monrovia, CA (US)

(73) Assignee: WEBASTO CHARGING SYSTEMS, INC., Monrovia, CA (US)

( * ) Notice: Subject to any disclaimer, the term of this patent is extended or adjusted under 35 U.S.C. 154(b) by 664 days.

(21) Appl. No.: 17/127,787

(22) Filed: Dec. 18, 2020

(65) Prior Publication Data

US 2022/0199296 A1 Jun. 23, 2022

(51) Int. Cl.
*H01C 7/108* (2006.01)
*H01R 13/10* (2006.01)
*H01R 13/66* (2006.01)

(52) U.S. Cl.
CPC ............. *H01C 7/108* (2013.01); *H01R 13/10* (2013.01); *H01R 13/66* (2013.01)

(58) Field of Classification Search
CPC .... H01R 13/10; H01R 13/66; H01R 13/6608; H01R 13/6616; H01R 24/38; H01R 24/40; H01R 24/48; H01C 7/108
See application file for complete search history.

(56) References Cited

U.S. PATENT DOCUMENTS

| | | | |
|---|---|---|---|
| 4,113,333 | A | 9/1978 | Horowitz |
| 11,233,357 | B2* | 1/2022 | Lo ..................... H01R 13/6272 |
| 2007/0188130 | A1 | 8/2007 | Scheucher |
| 2011/0223803 | A1 | 9/2011 | Mortun |
| 2018/0248322 | A1 | 8/2018 | Foran |

FOREIGN PATENT DOCUMENTS

| | | |
|---|---|---|
| EP | 0634818 A2 | 1/1995 |
| EP | 0644622 A3 | 3/1996 |
| GB | 2558010 A | 7/2018 |

OTHER PUBLICATIONS

International Search Report and Written Opinion for PCT/US2021/060124, dated Mar. 9, 2022.

* cited by examiner

*Primary Examiner* — Oscar C Jimenez
*Assistant Examiner* — Paul D Baillargeon
(74) *Attorney, Agent, or Firm* — Concept IP LLP; Michael Zarrabian

(57) ABSTRACT

An electrical assembly comprising an electrical connector assembly that may include: a utility device comprising a plurality of pins; a socket attached to a cord, the socket comprising a plurality of receptacles to receive the plurality of pins; and one or more metal-oxide varistors (MOVs) disposed inside the socket, where the one or more MOVs are electrically connected to the plurality of pins when the plurality of pins are received by the plurality of receptacles.

20 Claims, 6 Drawing Sheets

METAL-OXIDE VARISTORS (MOVS) IN GRID CORD CONNECTOR

TECHNOLOGICAL FIELD

Example embodiments of the present invention generally relate to power transfer devices and more particularly relate to an electrical switchgear assembly.

BACKGROUND

An electrical connector is an apparatus used to transfer electricity from a power supply to a utility device. The electrical connector contains multiple components working together to provide a rated supply to the utility device. The multiple components present in the electrical connector also protect the utility device from damage during a fault condition. Therefore, the electrical connector is subjected to various testing methods before being made available to the user. Although the electrical connectors have multiple components, some components may be disconnected during certain tests. This is done because those components may not withstand the voltage and current levels of some testing methods. Conventionally, the components that need to be disconnected are disassembled before the test and subsequently reconnected in the electrical connector after the test is complete. The reconnection is done to provide the electrical connector as a single device package. However, this requires a separate assembly station for reconnection and is uneconomical. Further, assembling the components again is laborious, reduces factory output, and negatively impacts time to market.

SUMMARY

An electrical connector assembly may include: a utility device comprising a plurality of pins; a socket attached to a cord, the socket comprising a plurality of receptacles to receive the plurality of pins; and one or more metal-oxide varistors (MOVs) disposed inside the socket, where the one or more MOVs are electrically connected to the plurality of pins when the plurality of pins are received by the plurality of receptacles.

In additional electrical connector assembly embodiments, the socket may further comprise a first end and a second end, where the first end may be distal from the second end, and where the first end may be proximate openings of the plurality of receptacles. In additional electrical connector assembly embodiments, the second end may be proximate the one or more MOVs. In additional electrical connector assembly embodiments, the plurality of receptacles further comprises at least one coaxial ring to receive a ground pin of the plurality of pins.

In additional electrical connector assembly embodiments, the socket may further comprise: an inner socket; and an outer case, where the outer case may be circularly arranged around the inner socket and defining a gap therebetween, where the outer case may be rotatably engaged to the cord. In additional electrical connector assembly embodiments, the utility device may further comprise: an outer wall defining a chamber to receive the inner socket, where the outer wall comprises a retention structure adapted to engage with an engagement structure to secure the outer case to the utility device to prevent disengagement of the plurality of pins from the plurality of receptacles.

In additional electrical connector assembly embodiments, the retention structure comprises a groove defined by an outer surface of the outer wall. In additional electrical connector assembly embodiments, the engagement structure comprises a protrusion extending radially inwardly from an inner surface of the outer cover. In additional electrical connector assembly embodiments, the groove comprises: a first portion extending axially from an end of the utility device to facilitate an insertion of the protrusion inside the groove; and a second portion extending circularly from the first portion and arranged along at least a portion of a circumference of the outer wall, where the protrusion may be engaged with the second portion to secure the outer case with the utility device.

In additional electrical connector assembly embodiments, the plurality of pins comprise: a communication pin; two power pins; and a ground pin. In additional electrical connector assembly embodiments, the communication pin has a shortest length of the plurality of pins. In additional electrical connector assembly embodiments, the ground pin has a longest length of the plurality of pins. In additional electrical connector assembly embodiments, the plurality of receptacles comprise: a communication receptacle configured to receive the communication pin; two power receptacles configured to receive the two power pins; a ground receptacle configured to receive the ground pin; and a coaxial ring coaxial to the ground receptacle, where the coaxial ring may be configured to receive the ground pin before the ground receptable.

In additional electrical connector assembly embodiments, the plurality of pins comprise: a communication pin; two power pins; and two ground pins. In additional electrical connector assembly embodiments, the plurality of receptacles comprise: a communication receptacle configured to receive the communication pin; two power receptacles configured to receive the two power pins; and two ground receptacles configured to receive the two ground pins.

Another electrical assembly embodiment may include: a utility device comprising a plurality of pins; a socket attached to a cord, the socket comprising a plurality of receptacles to receive the plurality of pins; and one or more metal-oxide varistors (MOVs) disposed inside the socket, where the one or more MOVs are electrically connected to the plurality of pins when the plurality of pins are received by the plurality of receptacles; one or more engagement structures of the socket; an inner wall of the utility device defining a chamber to receive the one or more engagement structures of the socket, where the inner wall comprises a retention structure adapted to engage with the one or more engagement structures to secure the socket to the utility device to prevent a disengagement of the plurality of pins from the plurality of receptacles.

In additional electrical assembly embodiments, the socket may further include: an inner socket; and an outer case, where the outer case may be circularly arranged around the inner socket, and where the outer case may be rotatably engaged to the cord. In additional electrical assembly embodiments, rotation of the outer case relative to the inner socket secures the socket to the utility device by securing the one or more engagement structures of the socket in the retention structure of the utility device.

Another electrical assembly embodiment may include: a utility device comprising a plurality of pins, where the plurality of pins comprise: one or more communication pins; two or more power pins; and one or more ground pins; a socket comprising a plurality of receptacles to receive the plurality of pins, where the plurality of receptacles comprise: one or more communication receptacles configured to receive the one or more communication pins; two or more power receptacles configured to receive the two or more power pins; and one or more ground receptacles configured to receive the one or more ground pins; one or more metal-oxide varistors (MOVs) disposed inside the socket, where the one or more MOVs are electrically connected to the plurality of pins when the plurality of pins are received by the plurality of receptacles.

In additional electrical assembly embodiments, the one or more ground pins are longer than each other pin of the plurality of pins, such that the one or more ground pins make contact with the one or more ground receptacles before each other pin of the plurality of pins makes contact with each other receptacle of the plurality of receptacles.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Embodiments of the present invention are illustrated by way of example and not limitation in the figures of the accompanying drawings, which may not be drawn to scale, and in which.

DETAILED DESCRIPTION

The description herein is made for the purpose of illustrating the general principles of the embodiments disclosed herein and is not meant to limit the concepts disclosed herein. Further, particular features described herein can be used in combination with other described features in each of the various possible combinations and permutations. Unless otherwise specifically defined herein, all terms are to be given their broadest possible interpretation including meanings implied from the description as well as meanings understood by those skilled in the art and/or as defined in dictionaries, treatises, etc.

In the following description, for purposes of explanation, numerous specific details are set forth in order to provide a thorough understanding of the present invention. It will be apparent, however, to one skilled in the art that the present invention may be practiced without these specific details.

The embodiments are described herein for illustrative purposes and are subject to many variations. It is understood that various omissions and substitutions of equivalents are contemplated as circumstances may suggest or render expedient but are intended to cover the application or implementation without departing from the spirit or the scope of the present invention. Further, it is to be understood that the phraseology and terminology employed herein are for the purpose of the description and should not be regarded as limiting. Any heading utilized within this description is for convenience only and has no legal or limiting effect.

Various embodiments provide an electrical connector assembly having a plug and a socket. The electrical connector assembly eliminates the need for a separate assembly line in a factory for reassembling components after performing testing procedures. For example, the electrical connector assembly eliminates the need for disassembling a metal-oxide varistor (MOV) and a ground wire during End of Line (EoL) testing and subsequent reassembling after the completion of the EoL testing. In some embodiments, the electrical connector assembly also provides a locking mechanism to ensure the socket is securely mounted on the plug thereby preventing sudden disengagement due to one or more external factors like weather, vandalism, or the like. The electrical connector assembly ensures the safety of the user by having an additional ground pin and communication pins as disclosed herein.

Figure 1A:
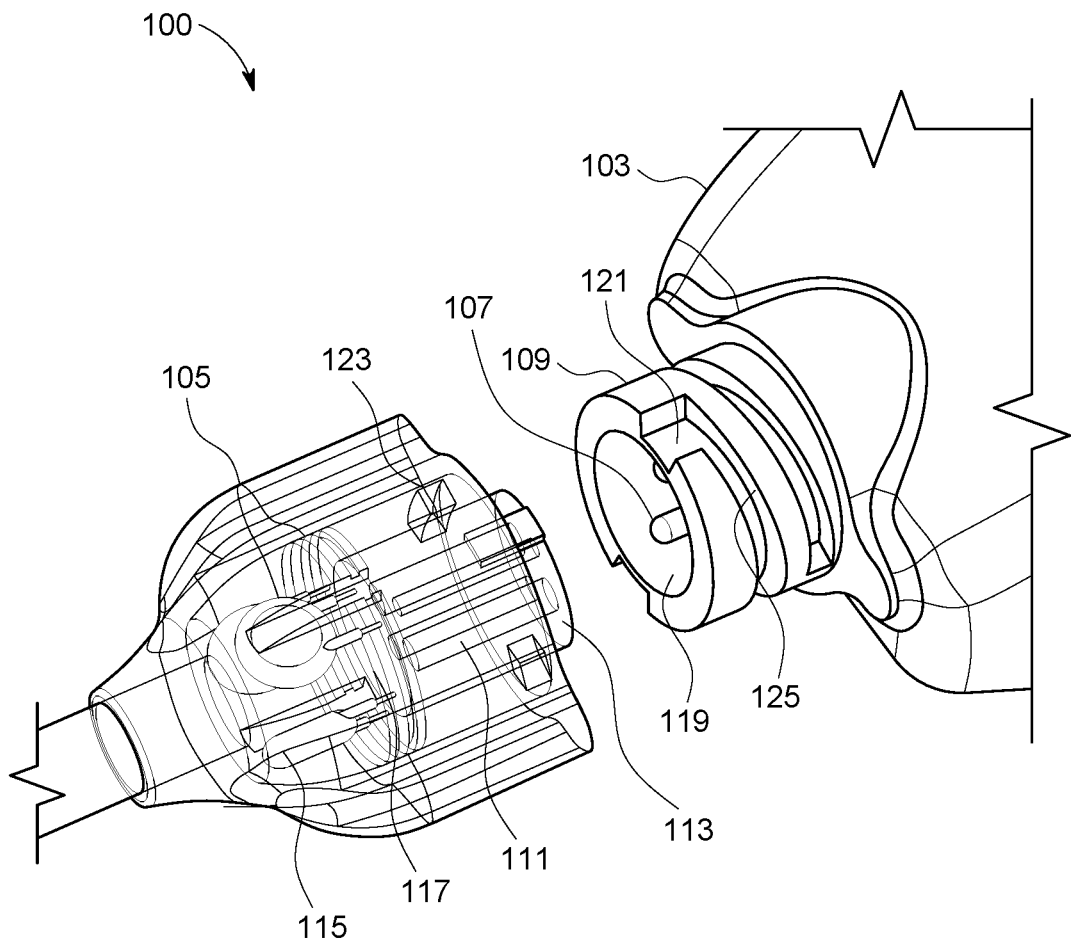
FIG. 1A shows a perspective partially transparent view of an exemplary electrical connector assembly, in accordance with an example embodiment of the present invention.
Figure 2:
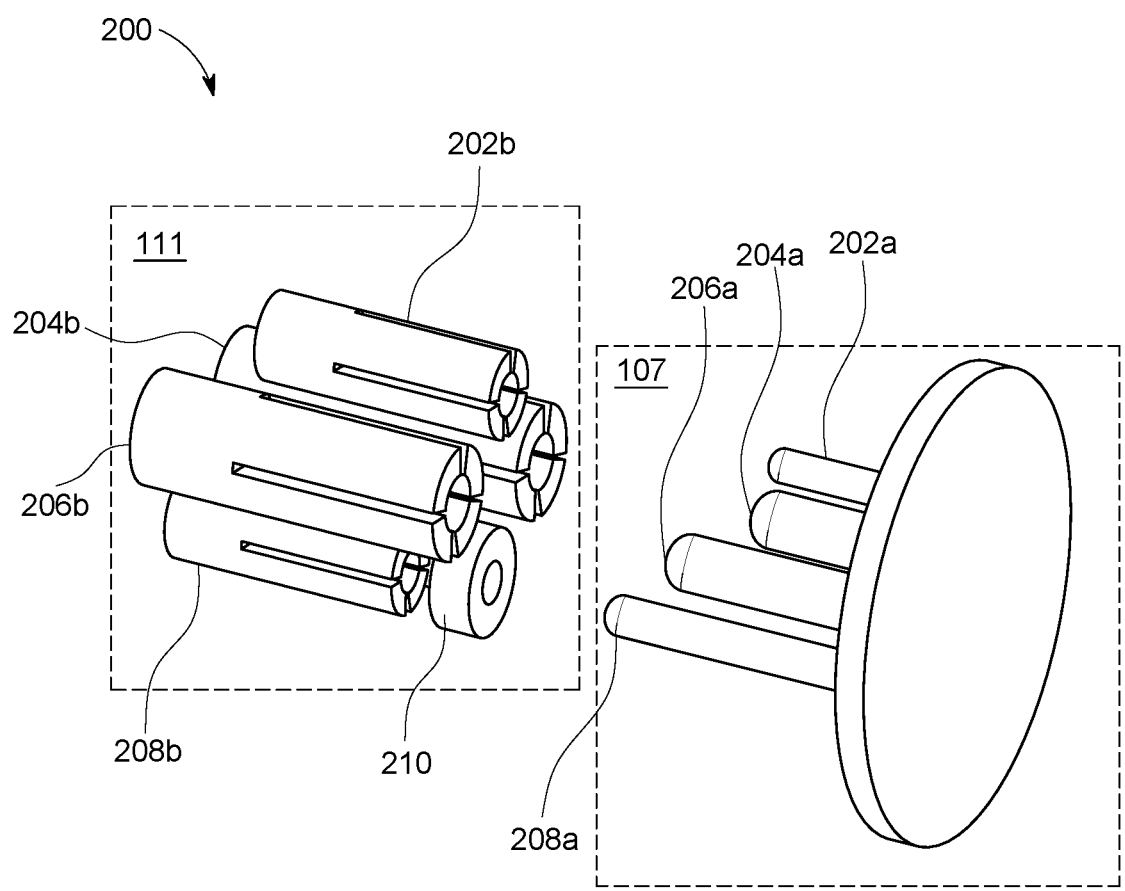
FIG. 2 shows an exemplary plug and socket assembly corresponding to the electrical connector assembly of FIG. 1A, having four pins, in accordance with an example embodiment of the present invention.

FIG. 1A illustrates a perspective partially transparent view of an exemplary electrical connector assembly 100, in accordance with an example embodiment of the present invention. The connector assembly 100 includes a utility device 103 and a socket 105. The utility device 103 includes an outer wall 109 defining a chamber 119 to receive the socket 105. The outer wall 109 includes a retention structure 121 adapted to engage with an engagement structure 123 of the socket 105 to secure the socket 105 to the utility device 103 during charging. The retention structure 121 may be a groove 125 defined by an outer surface of the outer wall 109. The utility device 103 includes a plurality of pins 107 disposed inside the chamber 119 at an end, as shown in FIGS. 2-3. The plurality of pins 107 are adapted to be inserted into a plurality of receptacles 111 disposed inside the socket 105, as shown in FIGS. 2-3. The plurality of receptacles 111 are adapted to receive the plurality of pins 107 at a first end 113 of the socket 105. The first end 113 of the socket 105 may be distal from the cord and proximate openings of the plurality of receptacles 111. The plurality of receptacles 111 and/or the plurality of pins 107 disposed in the plurality of receptacles 111 are electrically connected to one or more metal-oxide varistors (MOVs) 115 at a second end 117 of the socket 105. The second end 117 of the socket 105 may be disposed within a cover of the socket 105 and distal from the first end 113 of the socket 105.

As the one or more MOVs 115 are not present inside the utility device 103 of the connector assembly 100, the utility device 103 may be assembled subjected to various testing procedures irrespective of the one or more MOVs 115. Therefore, dismantling and reassembling components present inside the utility device 103 of the electrical connector assembly 100 is eliminated. In some embodiments, the electrical connector assembly 100 may be used to transfer power from a charging station to a vehicle. In such cases, the utility device 103 of the electrical connector assembly 100 is connected to the vehicle-side to transfer power from the charging station to a battery of the vehicle. In some embodiments, the utility device 103 of the electrical connector assembly 100 comprising the plurality of pins 107 may be a four-pin configuration as discussed in FIG. 2 or a five-pin configuration as discussed in FIG. 3A.

Figure 1B:
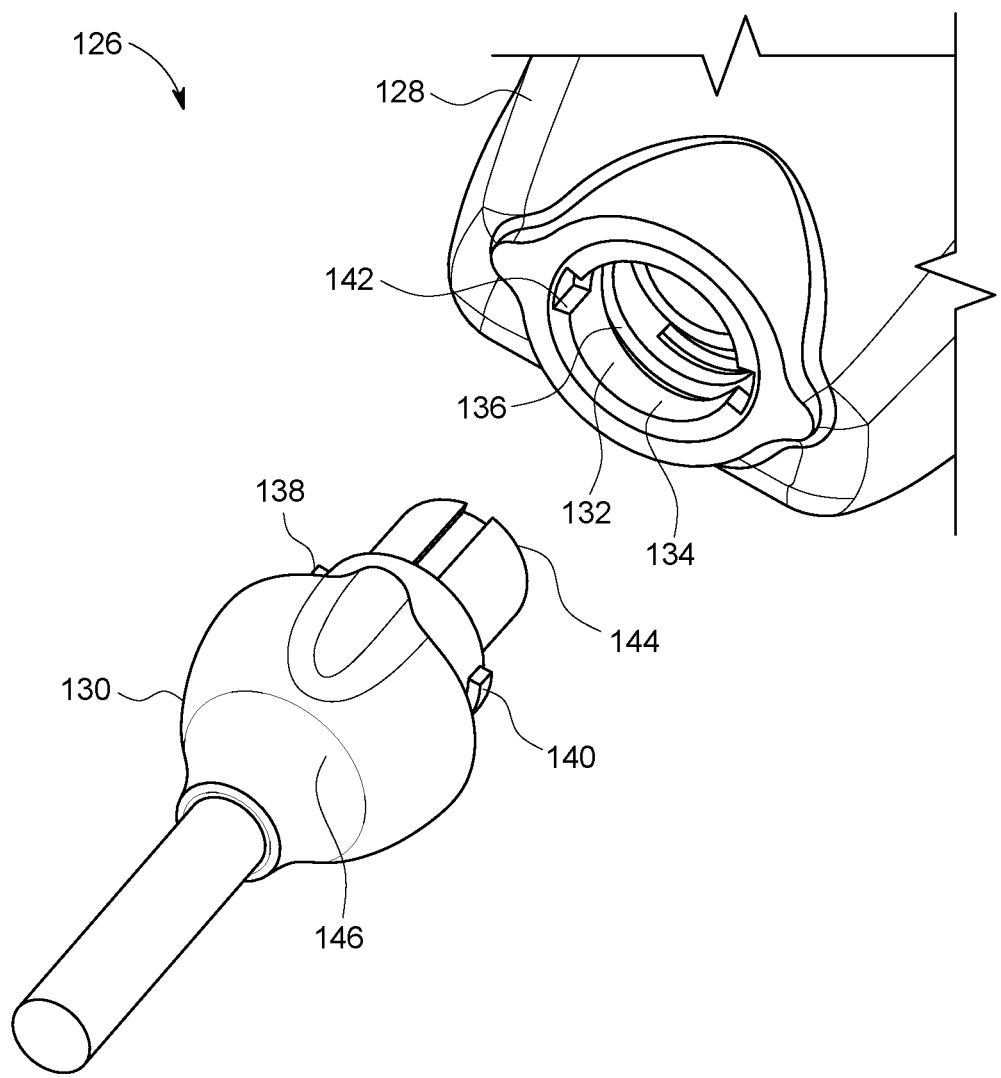
FIG. 1B shows a perspective view of an alternate electrical connector assembly, in accordance with an example embodiment of the present invention.

FIG. 1B shows a perspective view of an alternate electrical connector assembly 126, in accordance with an example embodiment of the present invention. The connector assembly 126 shown in FIG. 1B may have a twist connector disposed on an inside wall of the connector assembly 126 in some embodiments so as to reduce a risk of damage if the assembly 126 is dropped as compared to the twist connector disposed on an outer wall of the connector assembly as in FIG. 1A. The connector assembly 126 includes a utility device 128 and a socket 130. The utility device 128 includes an inner wall 132 defining a chamber 134 to receive the socket 130. The inner wall 132 includes a retention structure 136 adapted to engage with one or more engagement structures 138, 140 of the socket 130 to secure the socket 130 to the utility device 128 during charging. The retention structure 136 may be a groove 142 defined by an inner surface of the inner wall 132. The utility device 128 includes a plurality of pins (not shown in the figure) disposed inside the chamber 134 at an end, as shown in FIGS. 2-3. The plurality of pins is adapted to be inserted into a plurality of receptacles (not shown in the figure) disposed inside the socket 130, as shown in FIGS. 2-3. The plurality of receptacles is adapted to receive the plurality of pins at a first end 144 of the socket 130. The first end 144 of the socket 130 may be distal from the cord and proximate openings of the plurality of receptacles. The plurality of receptacles and/or the plurality of pins disposed in the plurality of receptacles may be electrically connected to one or more metal-oxide varistors (MOVs) at a second end 146 of the socket 130. The second end 146 of the socket 130 may be disposed within a cover of the socket 130 and distal from the first end 144 of the socket 130.

FIG. 2 shows an exemplary plug and socket assembly 200 corresponding to the electrical connector assembly of FIG. 1A having four pins, in accordance with an example embodiment of the present invention. The plug and socket assembly 200 comprise a plurality of pins 107 disposed inside the utility device (103, FIG. 1A). In a preferred embodiment, the plurality of pins 107 may comprise four pins 202a, 204a, 206a, and 208a. The pin 202a has a length and diameter that is relatively less when compared with the remaining pins 204a, 206a, and 208a. The pin 202a is a communication pin that transmits communication signals between the utility device (103, FIG. 1A) and the socket (105, FIG. 1A). The length and diameter of the pin 202a is relatively shorter to ensure that the pin 202a breaks first when the utility device (103, FIG. 1A) and the socket (105, FIG. 1A) are pulled apart and connects last when the utility device (103, FIG. 1A) and the socket (105, FIG. 1A) are pushed together. That is, the pin 202a makes contact with receptacle 202b after all the remaining pins are connected so that the pin 202a can transmit the communication signal to the utility device circuit that the electrical connector assembly 100 is connected successfully. However, when a fault occurs or when external stress is applied to the electrical connector assembly 100, the pin 202a breaks first so that the communication signal is interrupted for the utility device circuit and charging though the electrical connector assembly 100 may be stopped. The pins 204a and 206a are power pins that are used to transfer power from the power supply mains. The pin 208a is a ground pin that is used to connect the electrical connector assembly 100 to the ground. The ground pin 208a provides crucial ground protection to the user. The pin 208a comprises a length that is relatively greater than the remaining pins. The length of the pin 208a is relatively greater than the remaining pins to ensure that the electrical connector assembly 100 is first connected to the ground before making contact with the power supply mains thereby protecting the user and/or the electrical connector assembly 100.

The plug and socket assembly 200 comprises a plurality of receptacles 111 disposed inside the socket (105, FIG. 1A). In a preferred embodiment, the plurality of receptacles 111 may comprise four receptacles 202b, 204b, 206b, and 208b. The plurality of receptacles 111 further comprises at least one coaxial ring 210. The coaxial ring 210 is adapted to be coaxial to the receptacle 208b. The receptacle 208b is adapted to receive the ground pin 208a of the plurality of pins 107. The coaxial ring 210 ensures that the ground pin 208a is securely connected to the receptacle 208b thereby ensuring the safety of the user. The four receptacles 202b, 204b, 206b, and 208b of the plurality of receptacles 111 are adapted to receive the four pins 202a, 204a, 206a, and 208a of the plurality of pins 107, respectively. The plurality of pins 107 and the plurality of receptacles 111 enables the plug and socket assembly 200 to transfer power from the power supply mains to the utility device such as a battery of an electric vehicle. In some embodiments, the electrical connector assembly 100 may be configured with a plug and socket assembly having five pins as discussed in FIG. 3A.

Figure 3A:
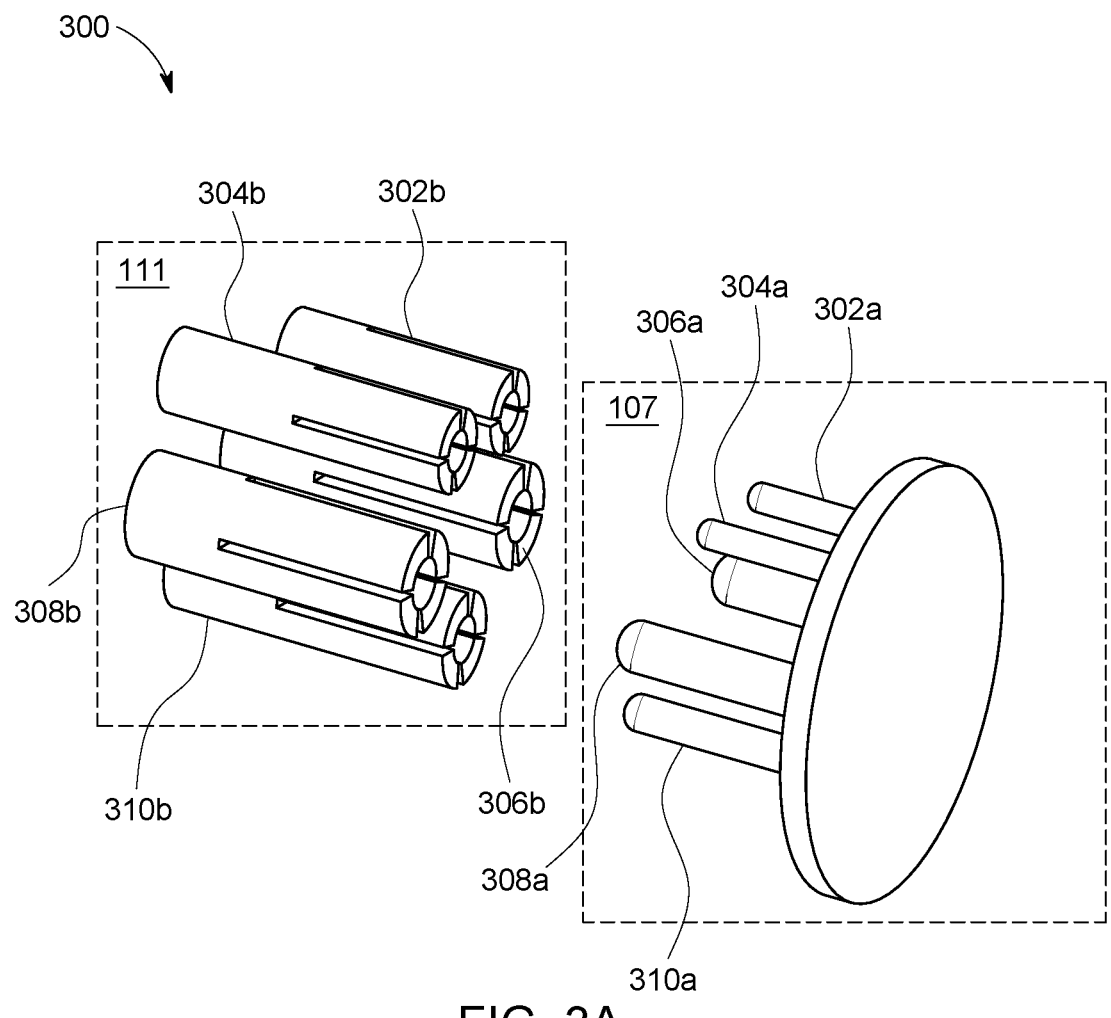
FIG. 3A shows an exemplary plug and socket assembly corresponding to the electrical connector assembly of FIG. 1A, having five pins, in accordance with an example embodiment of the present invention.

FIG. 3A shows an exemplary plug and socket assembly 300 corresponding to the electrical connector assembly of FIG. 1A having five pins, in accordance with an example embodiment of the present invention. The plug and socket assembly 300 comprises a plurality of pins 107 disposed inside the utility device (103, FIG. 1A) of the electrical connector assembly 100. In a preferred embodiment, the plurality of pins 107 may comprise five pins 302a, 304a, 306a, 308a, and 310a. The plug and socket assembly 300 of FIG. 3A differs from the plug and socket assembly 200 of FIG. 2 in that the plug and socket assembly 300 comprises an additional ground pin 304a in parallel to a utility ground pin 302a. Further, the plug and socket assembly 300 having five pins does not contain an additional coaxial ring for securing the ground pin.

The plug and socket assembly 300 comprises a plurality of receptacles 111 disposed inside the socket 105. In a preferred embodiment, the plurality of receptacles 111 may comprise five receptacles 302b, 304b, 306b, 308b and 310b. The pins 302a and 304a are ground pins that ensure the electrical connector assembly (100, FIG. 1A) is securely connected to the ground during fault conditions. The ground pins 302a and 304a may connect the MOVs to the utility ground circuit. In some embodiments, the two ground pins 302a and 304a may be longer than the other pins so as to be connected first. The MOVs are connected to one ground socket and the utility ground to the other ground socket. The two ground pins 302a and 304a may be connected together in the device. Once the connector is mated, the two connected ground pins 302a and 304a may connect the MOVs to the utility ground. The pins 306a and 308a are power pins that are used to transfer power from the power supply mains. The pin 310a is the communication pin.

The plug and socket assembly 300 comprises a plurality of receptacles 111 disposed inside the socket (105, FIG. 1A). In a preferred embodiment, the plurality of receptacles 111 may comprise five receptacles 302b, 304b, 306b, 308b and 310b. The five receptacles 302b, 304b, 306b, 308b, and 310b of the plurality of receptacles 111 are adapted to receive the five pins 302a, 304a, 306a, 308a, and 310a of the plurality of pins 107, respectively. The plurality of pins 107 and the plurality of receptacles 111 enables the plug and socket assembly 300 to transfer power from the power supply mains to the utility device. The plurality of receptacles 111 is adapted to receive the plurality of pins 107 at the first end of the socket (105, FIG. 1A), as discussed in FIG. 4.

Figure 3B:
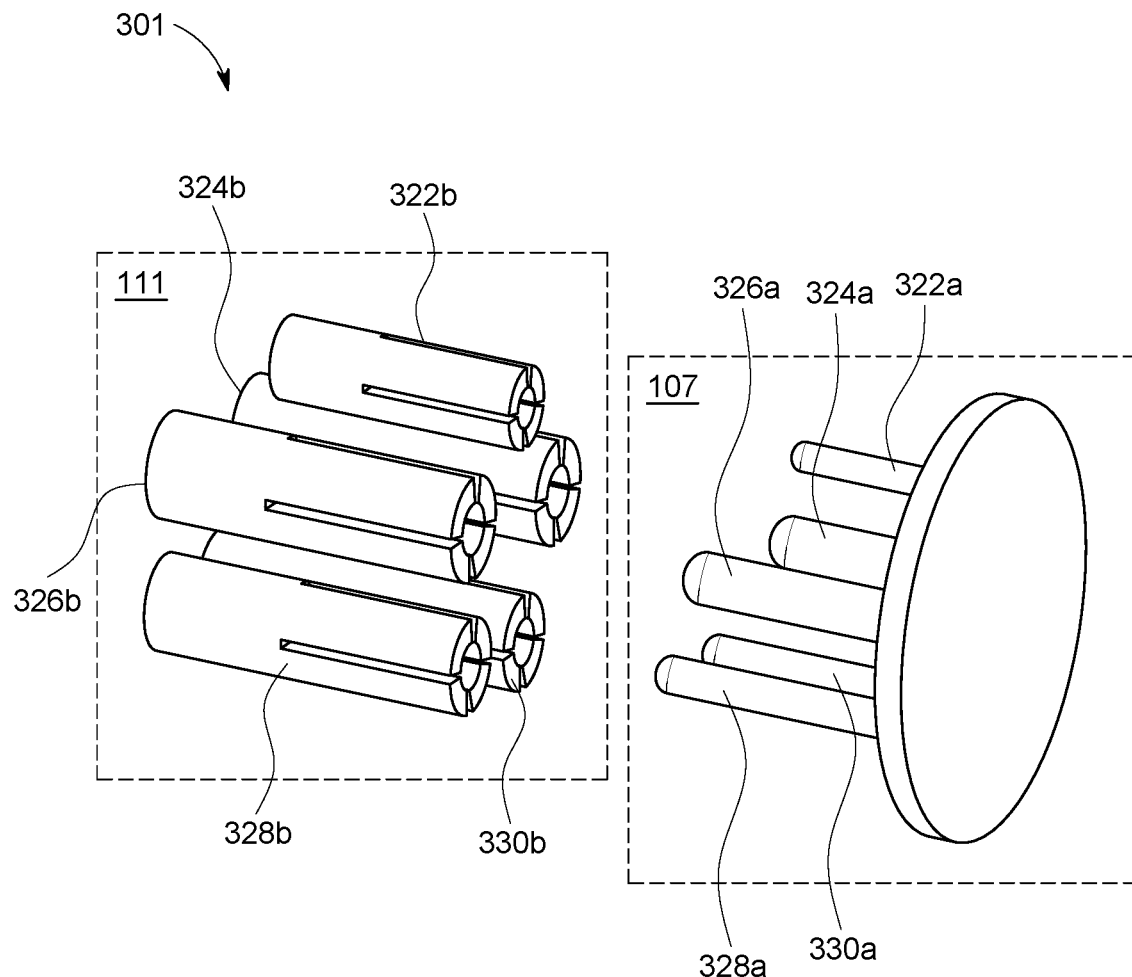
FIG. 3B shows an alternate plug and socket assembly corresponding to the electrical connector assembly of FIG. 1A, having five pins, in accordance with an example embodiment of the present invention.

FIG. 3B shows an alternate plug and socket assembly 301 corresponding to the electrical connector assembly of FIG. 1A, having five pins, in accordance with an example embodiment of the present invention. The plug and socket assembly 301 comprises a plurality of pins 107 disposed inside the utility device (103, FIG. 1A) of the electrical connector assembly 100. In a preferred embodiment, the plurality of pins 107 may comprise five pins 322a, 324a, 326a, 328a, and 330a. The plug and socket assembly 300 of FIG. 3B differs from the plug and socket assembly 300 of FIG. 3A in that the ground pins 328a and 330a are longer and make or break contact first.

The plug and socket assembly 301 comprises a plurality of receptacles 111 disposed inside the socket 105. In a preferred embodiment, the plurality of receptacles 111 may comprise five receptacles 322b, 324b, 326b, 328b and 330b. The pins 328a and 330a are ground pins that ensure the electrical connector assembly (100, FIG. 1A) is securely connected to the ground during fault conditions. The ground pins 328a and 330a may connect the MOVs to the utility ground circuit. In some embodiments, the two ground pins 328a and 330a may be longer than the other pins so as to be connected first. In other embodiments, the ground pins may be shorter, such as shown in FIG. 3A. The MOVs are connected to one ground socket and the utility ground to the other ground socket. The two ground pins 328a and 330a may be connected together in the device. Once the connector is mated, the two connected ground pins 328a and 330a may connect the MOVs to the utility ground. The pins 324a and 326a are power pins that are used to transfer power from the power supply mains. The pin 322a is the communication pin.

The plug and socket assembly 301 comprises a plurality of receptacles 111 disposed inside the socket (105, FIG. 1A). In a preferred embodiment, the plurality of receptacles 111 may comprise five receptacles 322b, 324b, 326b, 328b and 330b. The five receptacles 322b, 324b, 326b, 328b, and 330b of the plurality of receptacles 111 are adapted to receive the five pins 322a, 324a, 326a, 328a, and 330a of the plurality of pins 107, respectively. The plurality of pins 107 and the plurality of receptacles 111 enables the plug and socket assembly 301 to transfer power from the power supply mains to the utility device. The plurality of receptacles 111 is adapted to receive the plurality of pins 107 at the first end of the socket (105, FIG. 1A), as discussed in FIG. 4.

Figure 4:
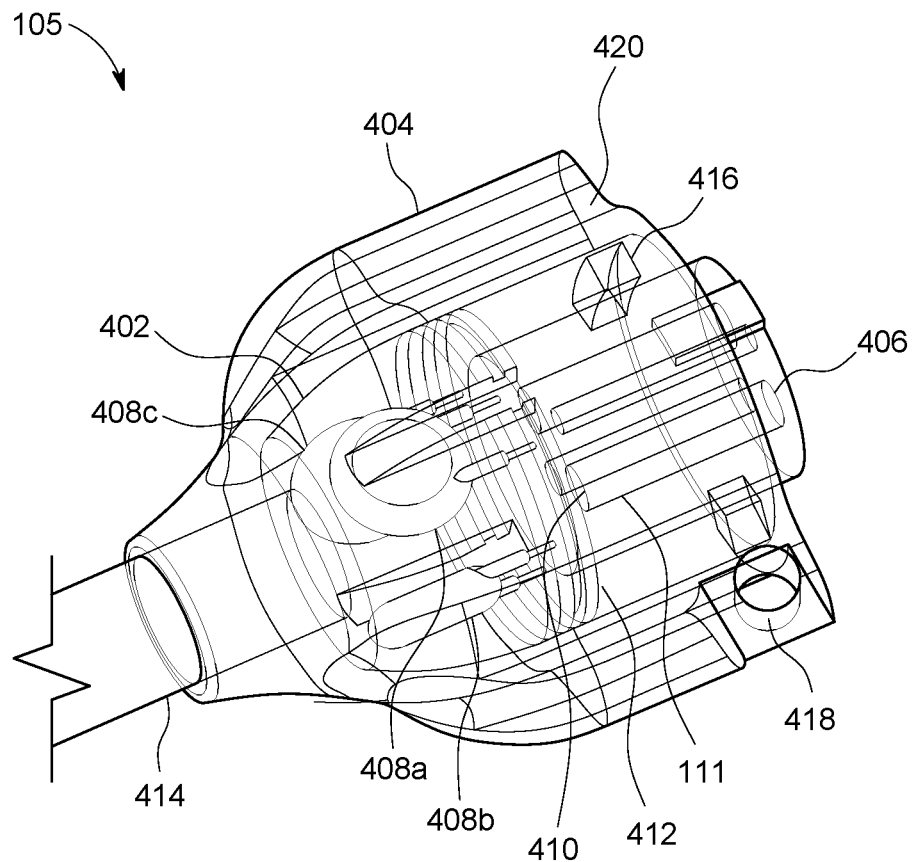
FIG. 4 shows another embodiment of an exemplary socket assembly, in accordance with an example embodiment of the present invention.

FIG. 4 shows another embodiment of an exemplary socket assembly 105, in accordance with an example embodiment of the present invention. The socket assembly 105 comprises an inner socket 402, and an outer case 404 attached to a cord 414. The outer case 404 is circularly arranged around the inner socket 402 and provides a gap 420 between the inner socket 402 and the outer case 404. The outer case 404 is rotatably engaged to the cord 414. The socket assembly 105 further comprises a plurality of receptacles 111. The plurality of receptacles 111 are adapted to receive the plurality of pins (107, FIGS. 1-3) at a first end 406 of the socket assembly 105. The first end 406 corresponds to the first end 113 of FIG. 1A. The plurality of receptacles 111 are electrically connected to one or more MOVs 408a-408c at a second end 410. In some embodiments, the plurality of receptacles 111 may be electrically connected to the one or more MOVs 408a-408c by a circuit board 412. The one or more MOVs 408a-408c and the second end 410 corresponds to the MOV 115 and the second end 117 of FIG. 1A, respectively. The one or more MOVs 408a-408c may be connected to the circuit board 412 by one or more of soldering, welding, stamping, clamping, or the like.

In some embodiments, the one or more MOVs 408a-408c may be a plurality of MOVs 408a, 408b, and 408c connected to the circuit board 412. In some embodiments, the second socket 404 comprises an engagement structure 416 to lock the outer case 404 with the utility device (103, FIG. 1A) to prevent disengagement of the plurality of pins (107, FIGS. 1-3) from the plurality of receptacles 111. The engagement structure 416 corresponds to the engagement structure 123 of FIG. 1A. In some embodiments, the second socket 404 comprises an aperture 418 through which an external lock can be engaged to prevent disengagement of the plurality of pins (107, FIGS. 1-3) from the plurality of receptacles 111. In some embodiments, a temperature sensor may be disposed on the circuit board 412 to measure internal temperature of the electrical connector assembly 100. The temperature sensor may provide an indication or an alert to the user when the internal temperature of the electrical connector assembly (100, FIG. 1A) exceeds a threshold temperature value.

The socket assembly (105, FIG. 1A) of the electrical connector assembly (100, FIG. 1A) ensures that the one or more MOVs 408a-408c and the ground pins are connected to the utility device (103, FIG. 1A) after utility device (103, FIG. 1A) is subjected to various testing methods. In a preferred embodiment, the socket (105, FIG. 1A) comprising the MOVs 408a-408c and the ground pin is connected after the End of Line (EoL) testing is performed on the electrical connector assembly (100, FIG. 1A) and before sealing the electrical connector assembly (100, FIG. 1A) as a single unit. Thus, need for additional assembly stations to dismantle and reassemble the multiple components of the electrical connector assembly 100 is eliminated.

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention herein disclosed by way of examples should not be limited by the disclosed embodiments described above.

We claim:

1. An electrical assembly, comprising:
a utility device comprising a plurality of pins;
a socket attached to a cord at one end and having a plurality of openings at the other end opposite to the one end to allow the plurality of pins to be entered therethrough, the socket comprising:
a plurality of receptacles to receive the plurality of pins, wherein each of the receptacles extends along an axis and including a first end at which one of the openings is formed and a second end opposite to the first end; and
a circuit board positioned to face the second ends of the plurality of receptacles, wherein the circuit board includes a first surface facing the second ends and a second surface opposite to the first surface;
one or more metal-oxide varistors (MOVs) disposed between the second surface of the circuit board and the cord inside the socket and connected onto the second surface of the circuit board, wherein the one or more MOVs are electrically connected to the plurality of pins through the circuit board disposed between the MOVs and the pins when the plurality of pins are received by the plurality of receptacles.

2. The electrical assembly of claim 1, wherein the socket further comprises a first end and a second end, wherein the first end is distal from the second end, and wherein the first end is proximate openings of the plurality of receptacles.

3. The electrical assembly of claim 2, wherein the second end is proximate the one or more MOVs.

4. The electrical assembly of claim 1, wherein the plurality of receptacles further comprises at least one coaxial ring to receive a ground pin of the plurality of pins, and wherein each of the at least one coaxial ring has only one hole through which only one of the ground pins passes.

5. The electrical assembly of claim 1, wherein the socket further comprises:
an inner socket; and
an outer case, wherein the outer case is circularly arranged around the inner socket and defining a gap therebetween, wherein the outer case is rotatably engaged to the cord.

6. The electrical assembly of claim 5, wherein the utility device further comprises:
an outer wall defining a chamber to receive the inner socket, wherein the outer wall comprises a retention structure adapted to engage with an engagement structure to secure the outer case to the utility device to prevent a disengagement of the plurality of pins from the plurality of receptacles.

7. The electrical assembly of claim 6, wherein the retention structure comprises a groove defined by an outer surface of the outer wall.

8. The electrical assembly of claim 7, wherein the engagement structure comprises a protrusion extending radially inwardly from an inner surface of the outer cover.

9. The electrical assembly of claim 8, wherein the groove comprises:
a first portion extending axially from an end of the utility device to facilitate an insertion of the protrusion inside the groove; and
a second portion extending circularly from the first portion and arranged along at least a portion of a circumference of the outer wall, wherein the protrusion is engaged with the second portion to secure the outer case with the utility device.

10. The electrical assembly of claim 1, wherein the plurality of pins comprise:
a communication pin;
two power pins; and
a ground pin.

11. The electrical assembly of claim 10, wherein the communication pin has a shortest length of the plurality of pins.

12. The electrical assembly of claim 10, wherein the ground pin has a longest length of the plurality of pins.

13. The electrical assembly of claim 10, wherein the plurality of receptacles comprise:
a communication receptacle configured to receive the communication pin;
two power receptacles configured to receive the two power pins;
a ground receptacle configured to receive the ground pin; and
a coaxial ring coaxial to the ground receptacle, wherein the coaxial ring is configured to receive the ground pin before the ground receptacle;
wherein each of the at least one coaxial ring has only one hole through which only one of the ground pins passes.

14. The electrical assembly of claim 1, wherein the plurality of pins comprise:
a communication pin;
two power pins; and
two ground pins.

15. The electrical assembly of claim 14, wherein the plurality of receptacles comprise:
a communication receptacle configured to receive the communication pin;
two power receptacles configured to receive the two power pins; and
two ground receptacles configured to receive the two ground pins.

16. An electrical assembly, comprising:
a utility device comprising a plurality of pins;
a socket attached to a cord at one end and having a plurality of openings at the other end opposite to the one end to allow the plurality of pins to be entered therethrough, the socket comprising:
a plurality of receptacles to receive the plurality of pins, wherein each of the receptacles extends along an axis and including a first end at which one of the openings is formed and a second end opposite to the first end; and
a circuit board positioned to face the second ends of the plurality of receptacles, wherein the circuit board includes a first surface facing the second ends and a second surface opposite to the first surface;
one or more metal-oxide varistors (MOVs) disposed between the second surface of the circuit board and the cord inside the socket and connected onto the second surface, wherein the one or more MOVs are electrically connected to the plurality of pins through the circuit board disposed between the MOVs and the pins when the plurality of pins are received by the plurality of receptacles; and
one or more engagement structures;
wherein the utility device further comprises an inner wall defining a chamber to receive the one or more engagement structures of the socket, wherein the inner wall comprises a retention structure adapted to engage with the one or more engagement structures to secure the socket to the utility device to prevent a disengagement of the plurality of pins from the plurality of receptacles.

17. The electrical assembly of claim 16, wherein the socket further comprises:
an inner socket; and
an outer case, wherein the outer case is circularly arranged around the inner socket, and wherein the outer case is rotatably engaged to the cord.

18. The electrical assembly of claim 17, wherein rotation of the outer case relative to the inner socket secures the socket to the utility device by securing the one or more engagement structures of the socket in the retention structure of the utility device.

19. An electrical assembly, comprising:
a utility device comprising a plurality of pins, wherein the plurality of pins comprises:
one or more communication pins;
two or more power pins; and
one or more ground pins;
a socket attached to a cord at one end and having a plurality of openings at the other end opposite to the one end to allow the plurality of pins to be entered therethrough, wherein the socket comprises:

a plurality of receptacles to receive the plurality of pins, wherein each of the plurality of receptacles extends along an axis, includes a first end at which one of the openings is formed and a second end opposite to the first end, and comprises:
    one or more communication receptacles configured to receive the one or more communication pins;
    two or more power receptacles configured to receive the two or more power pins; and
    one or more ground receptacles configured to receive the one or more ground pins;
a circuit board positioned to face the second ends of the plurality of receptacles, wherein the circuit board includes a first surface facing the second ends and a second surface opposite to the first surface; and
one or more metal-oxide varistors (MOVs) disposed between the second surface of the circuit board and the cord inside the socket and connected onto the second surface, wherein the one or more MOVs are electrically connected to the plurality of pins through the circuit board disposed between the MOVs and the pins when the plurality of pins are received by the plurality of receptacles.

20. The electrical assembly of claim 19, wherein the one or more ground pins are longer than each other pin of the plurality of pins, such that the one or more ground pins make contact with the one or more ground receptacles before each other pin of the plurality of pins makes contact with each other receptacle of the plurality of receptacles.

* * * * *